United States Patent [19]

Blake

[11] Patent Number: 5,644,397

[45] Date of Patent: Jul. 1, 1997

[54] FIBER OPTIC INTERFEROMETRIC CIRCUIT AND MAGNETIC FIELD SENSOR

[75] Inventor: James N. Blake, College Station, Tex.

[73] Assignee: The Texas A&M University System, College Station, Tex.

[21] Appl. No.: 620,121

[22] Filed: Mar. 26, 1996

Related U.S. Application Data

[63] Continuation of Ser. No. 320,734, Oct. 7, 1994, abandoned.

[51] Int. Cl.[6] ......................................................... G01B 9/02
[52] U.S. Cl. ............................................. 356/345; 356/351
[58] Field of Search ..................................... 356/345, 351; 250/227.17, 227.19, 227.27

[56] References Cited

U.S. PATENT DOCUMENTS

| | | | |
|---|---|---|---|
| 4,545,682 | 10/1985 | Greenwood | 356/350 |
| 4,578,639 | 3/1986 | Miller | 324/96 |
| 4,613,811 | 9/1986 | Vaerewyck et al. | 324/96 |
| 4,615,582 | 10/1986 | Lefevre et al. | |
| 4,733,938 | 3/1988 | Lefevre et al. | |
| 4,894,608 | 1/1990 | Ulmer, Jr. | 324/96 |

(List continued on next page.)

OTHER PUBLICATIONS

Guido Frosio and Rene Dandliker, "Reciprocal Reflection Interferometer for a Fiber–Optic Faraday Current Sensor", *Applied Optics,* 1 Sep. 1994, vol. 33, No. 25, pp. 6111–6122.
R. T. de Carvalho, J. Blake, and G. Sanders, "Sagnac Interferometers for Accurate Measurements of True Nonreciprocal Effects", *Spie,* vol. 2070, pp. 264–269, Sep. 1993.
Kent B. Rochford, Gordon W. Day, and Peter R. Forman, "Polarization Dependence of Response Functions in 3×3 Sagnac Optical Fiber Current Sensors", *Journal of Lightwave Technology,* vol. 12, No. 8, Aug. 1994, pp. 1504–1509.
P. A. Nicati and Ph. Robert, "Stabilised Current Sensor Using Sagnac Interferometer", *IOP Publishing Ltd.,* 1988, pp. 791–796.
H. Taylor, "Fiber Sensors: 2", *U.S. Naval Research Laboratory,* Apr. 29, 1981, pp. 128–130.
P. Akhavan Leilabady, A. P. Wayte, M. Berwick, J.D.C. Jones, and D. A. Jackson, "A Pseudo–Reciprocal Fibre–Optic Faraday Rotation Sensor: Current Measurement and Data Communication Applications", *Elsevier Science Publishers B. V.,* pp. 173–176, Sep. 1, 1986.
R. A. Bergh, H. C. Lefevre, and H. J. Shaw, "Geometrical Fiber Configuration for Isolators and Magnetometers", *Fiber–Optic Rotation Sensors and Related Technologies,* Springer Series in Optical Sciences 32, 1982, pp. 111–116.
P. A. Nicati and Ph. Robert, "Stabilized Sagnac Optical Fiber Current Sensor Using One Phase and Two Amplitude Modulations", *Swiss Federal Institute of Technology of Lausanne,* pp. 402–405.
I. G. Clarke, D. Geake, I. M. Bassett, S. B. Poole, and A. D. Stokes, "A Current Sensor Using Spun Birefringent Fibre in a Sagnac Configuration", *OFTC, University of Sydney, Australia,* pp. 167–170.
A. Yand A. S. Siddiqui, "A Theoretical and Experimental Investigation of a Practicable Fibre Optic Current Sensor Using Sagnac Interferometer", *Department of Electronic Systems Engineering, University of Essex,* pp. 289–292.
L. R. Veeser and G. W. Day, "Faraday Effect Current Sensing Using a Sagnac Interferometer with a 3×3 Coupler", *National Institute of Standards and Technology,* pp. 325–328.

*Primary Examiner*—Frank G. Font
*Assistant Examiner*—Amanda Merlino
*Attorney, Agent, or Firm*—Baker & Botts, L.L.P.

[57] ABSTRACT

A number of optical interferometric sensor configurations are provided. The interferometric sensors include a polarization maintaining optic fiber forming either a loop or linear optical path. Circularly polarized light propagate along the optical path and pass through a field-sensitive sensing medium. A differential phase shift induced in the light waves by a magnetic field is then detected by a photodetector and associated signal processing electronics.

42 Claims, 3 Drawing Sheets

U.S. PATENT DOCUMENTS

| | | | |
|---|---|---|---|
| 4,947,107 | 8/1990 | Doerfler et al. | 324/96 |
| 4,973,899 | 11/1990 | Jones et al. | 324/96 |
| 5,034,679 | 7/1991 | Henderson et al. | 324/96 |
| 5,051,577 | 9/1991 | Lutz et al. | 250/227.17 |
| 5,056,885 | 10/1991 | Chinn. | |
| 5,063,290 | 11/1991 | Kersey | 250/227.17 |
| 5,157,461 | 10/1992 | Page | 356/350 |
| 5,181,078 | 1/1993 | Lefevre et al. | 356/350 |
| 5,270,791 | 12/1993 | Lefevre et al. | 356/350 |
| 5,297,436 | 3/1994 | Chan et al. | 250/227.17 |

5,644,397

FIBER OPTIC INTERFEROMETRIC CIRCUIT AND MAGNETIC FIELD SENSOR

This application is a continuation of application Ser. No. 08/320,734, filed Oct. 7, 1994, entitled "Fiber Optic Interferometric Current and Magnetic Field Sensor" by James N. Blake, now abandoned.

TECHNICAL FIELD OF THE INVENTION

This invention relates in general to the field of fiber optic sensors. More particularly, the present invention relates to a fiber optic interferometric sensor.

BACKGROUND OF THE INVENTION

Over the past decade, Sagnac interferometers have received attention in the application of magnetic field sensing and current sensing. Fiber optic current sensors are particularly advantageous over iron-core current transformers, since fiber optic sensors are non-conductive and light weight. Furthermore, fiber optic sensors also do not exhibit hysteresis and provide a much larger dynamic range and frequency response.

Fiber optic current sensors work on the principle of the Faraday effect. Current flowing in a wire induces a magnetic field which, through the Faraday effect, rotates the plane of polarization of the light traveling in the optical fiber wound around the current carrying wire. Faraday's law, stated as $$I = \oint H \cdot dL$$

where I is the electrical current, H is the magnetic field and the integral is taken over a closed path around the current. If the sensing fiber is wound around the current carrying wire with an integral number of turns, and each point in the sensing fiber has a constant sensitivity to the magnetic field, then the rotation of the plane of polarization of the light in the fiber depends on the current being carried in the wire and is insensitive to all externally generated magnetic fields such as those caused by currents carried in nearby wires. The angle, $\Delta\phi$, through which the plane of polarization of light rotates in the presence of a magnetic field is given by $$\Delta\phi = V \oint H \cdot dL$$

where V is the Verdet constant of the fiber glass. The sensing optical fiber performs the line integral of the magnetic field along its path which is proportional to the current in the wire when that path closes on itself. Thus we have that $\Delta\phi = VNI$ where N is the number of turns of sensing fiber wound around the current carrying wire. The rotation of the state of polarization of the light due to the presence of an electrical current is measured by injecting light with a well defined linear polarization state into the sensing region, and then analyzing the polarization state of the light after it exits the sensing region.

This method of sensing current suffers from a number of difficulties. Exceptionally stable optical components are required for measuring the polarization state changes with the accuracy needed for certain applications such as revenue metering. In addition, birefringence present in the sensing region rotates the plane of polarization as well as current, yielding an indistinguishable signal. Mechanical disturbances such as vibrations in the sensing fiber can yield a time varying birefringence which yield signals indistinguishable from time varying currents. Similarly, thermal disturbances may also produce erroneous results.

Accordingly, a need has arisen for a fiber optic current and magnetic field sensor that is insensitive to rotation and time-varying effects such as changing temperature and vibration, does not require exceptionally stable optical components, and low birefringence in the sensing region.

SUMMARY OF THE INVENTION

In accordance with the present invention, optical interferometric sensor configurations are provided which eliminates or substantially reduces the disadvantages associated with prior optical sensors.

In one aspect of the invention, a number of optical interferometric sensor configurations are provided. The interferometric sensors include a polarization maintaining optic fiber forming either a loop or linear optical path. Co- or counter-propagating circularly polarized light waves propagate along the optical path and pass through a field-sensitive sensing medium. A differential phase shift induced in the light waves in the presence of a magnetic field is then detected by a photodetector and associated signal processing electronics.

In another aspect of the invention, an all-fiber sensor is provided in which fiber quarter wave plates are used to convert linearly polarized light into circularly polarized light. The quarter wave plate is preferably constructed from a short section of long beat length polarization maintaining fiber. The sensing medium may be made from a low birefringence optical fiber.

In yet another aspect of the invention, a loop sensor configuration detects both an electric and a magnetic field by utilizing both the in-phase and quadrature outputs. The sensor may also be used to measure the rotational movement of the loop.

BRIEF DESCRIPTION OF THE DRAWINGS

For a better understanding of the present invention, reference may be made to the accompanying drawings, in which.

DETAILED DESCRIPTION OF THE INVENTION

The preferred embodiment of the present invention and its advantages are best understood by referring to FIGS. 1–6 of the drawings, like numerals being used for like and corresponding parts of the various drawings. Furthermore, descriptions of elements are applicable to like elements in the various drawing figures.

Figure 1:
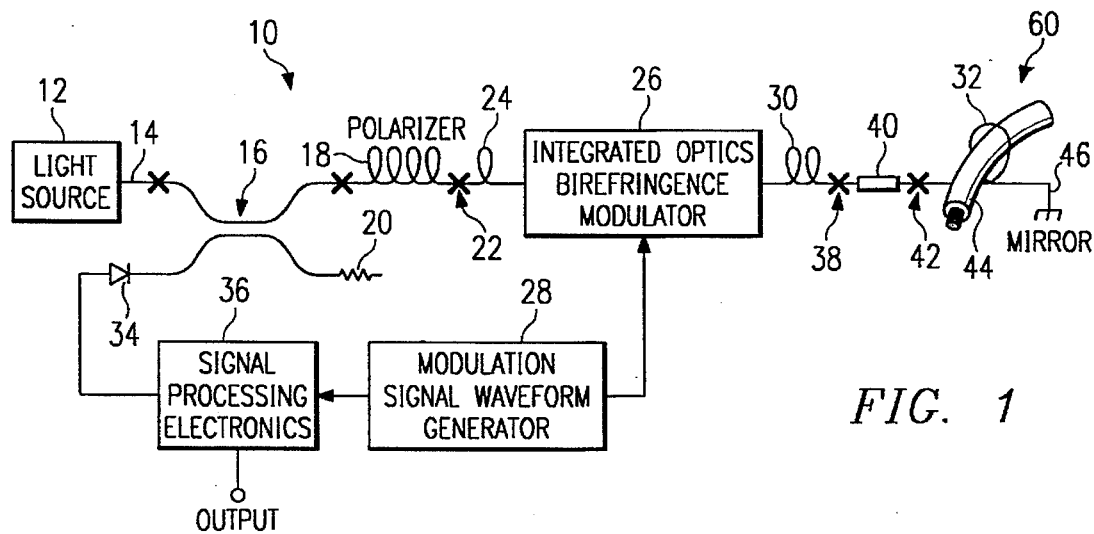
FIG. 1 is a schematic diagram of an embodiment of an in-line fiber optic interferometric current sensor.

In a preferred embodiment, shown in FIG. 1, the current sensor 10 of the present invention comprises a broadband light source 12, which introduces a broadband light having multiple optical frequency components into a optic fiber pigtail 14. The optic fiber pigtail 14 is preferably a length of polarization maintaining fiber. The polarization maintaining fiber pigtail 14, is joined to a polarization maintaining beam splitter or directional coupler 16 wherein 50% of the light is directed to a polarizer 18 and the remaining 50% of the light is terminated at a non-reflective termination point 20. The light beam is then passed through a polarizer 18, which linearly polarizes the light. The eigen-axes of the polarization maintaining fiber pigtail 14, the polarization maintaining beam splitter 16, and the polarizer 18 are aligned to one another and to the principle axis of the light source 12, so as to ensure maximum light input into the interferometer. Polarization cross coupling points caused by any misalignment of these axes, in combination with an imperfect polarizer, will result in the presence of small offsets in the current measurement and should be avoided as much as possible.

After the light has passed through the polarizer 18, it is divided substantially equally into X and Y light waves by a 45° splice 22 into the two eigen-axes, X and Y respectively, of a birefringence modulator pigtail 24. The birefringence modulator pigtail 24 is a section of polarization maintaining fiber of sufficient length to depolarize the light passing through it. The birefringence modulator pigtail 24 is connected to a birefringence modulator 26, the X and Y eigen axes of these two components being aligned. The birefringence modulator 26 is an integrated optics waveguide formed on Ti-indiffused $LiNbO_3$ with metallic electrodes surrounding the waveguide. A voltage applied across the electrodes alters the birefringence of the waveguide. A modulation signal generated by a waveform generator 28 is applied to the electrodes to dither or phase modulate the light beams. The modulation signal may be a variety of forms including, for example, sine wave modulation, square wave modulation, triangle wave modulation, serrodyne modulation, and other periodic waveforms.

Figure 2:
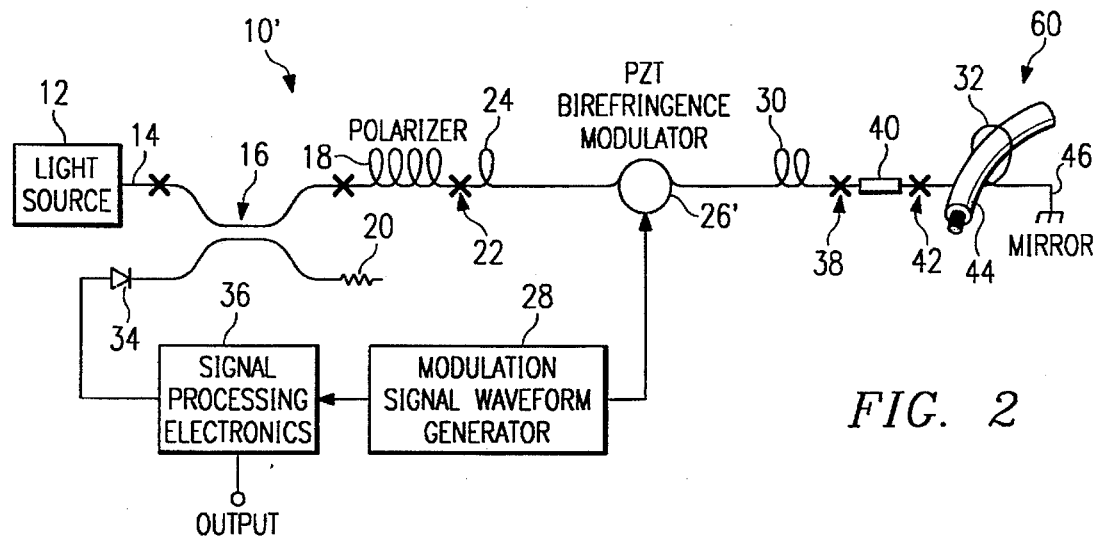
FIG. 2 is a schematic diagram of an embodiment of an in-line fiber optic interferometric current sensor with a piezoelectric birefringence modulator.

Alternatively, the birefringence modulator 26 and its pigtail 24 may be formed by winding a predetermined length of polarization maintaining fiber around a piezoelectric birefringence modulator 26' as shown in FIG. 2. Axial strains applied to the polarization maintaining fiber alter the fiber's birefringence. To obtain a sufficient depth of modulation, this approach requires a large axial strain to be applied to the polarization maintaining fiber, which may require the piezoelectric modulator 26' to be operated near one of its resonant frequencies.

Referring to FIGS. 1 and 2, after the light has passed the birefringence modulator 26 and 26', it enters a long polarization maintaining fiber bus 30. The principle axes of the polarization maintaining fiber bus 30 are aligned to the principle axes of the birefringence modulator 26 and 26'. The long polarization maintaining fiber bus 30 serves two purposes. The first is to carry the light to a passive sensing medium or sensing fiber 32, which is remotely located from the active elements such as the light source 12, the birefringence modulator 26 and 26', and a photodetector 34 and signal processing electronics 36. The second purpose of the polarization maintaining fiber bus 30 is to provide a time delay of sufficient length that the modulation waveform applied to the birefringence modulator 26 and 26' substantially changes its value during the time it takes for the light to propagate from the birefringence modulator 26 and 26' to the sensing region 32 and return. Ideally, the fundamental dither frequency of the waveform applied to the birefringence modulator 26 and 26' is $\frac{1}{2}\tau$ or odd multiples thereof, where $\tau$ is the propagation time for the light waves to travel from the birefringence modulator through the sensing medium and back.

After passing through the polarization maintaining fiber bus 30, the light goes through a 45° splice 38, a zero or multiple order quarter wave plate 40 set at 45° to the principle axes of the polarization maintaining fiber bus 30, and a single mode fiber splice 42. The purpose of the quarter wave plate 38 is to convert the orthogonally linearly polarized light from each of the principle axes of the polarization maintaining fiber bus 30 to circular states of polarization. The quarter wave plate 40 is preferably constructed from a short section of long beat length polarization maintaining fiber, ideally a quarter of a polarization beat length long. An odd multiple of quarter beat lengths of length is also acceptable. Constructed in this manner, unreliable bent fiber quarter wave plates and bulk optic quarter wave plates spliced into the fiber bus are avoided.

Therefore, two opposingly circularly polarized light waves are generated. The X light wave from the first principle axis or X axis of the polarization maintaining fiber bus 30 is converted by the quarter wave plate 40 to a right hand circularly polarized light wave. The Y light wave from the second principle axis or Y axis of the polarization maintaining fiber bus 30 is converted to a left hand circularly polarized light wave by the quarter wave plate 40. The two circularly polarized light waves then traverse the magnetic field sensing fiber 32 at different velocities, accumulating a phase difference in proportion to the magnetic field component aligned with the sensing fiber 32. The magnetic field sensing fiber 32 may be constructed from a single mode fiber having a low birefringence per unit length and wound an integral number of turns around a current carrying wire 44. For most applications, one to five loops of the sensing fiber 32 has been shown to be sufficient. It is known that birefringence in the sensing fiber 32 changes the sensitivity of the sensor as well as making it sensitive to magnetic fields arising from external sources. The use of a short length of sensing fiber 32 is thus advantageous for minimizing the total birefringence.

Figure 3:
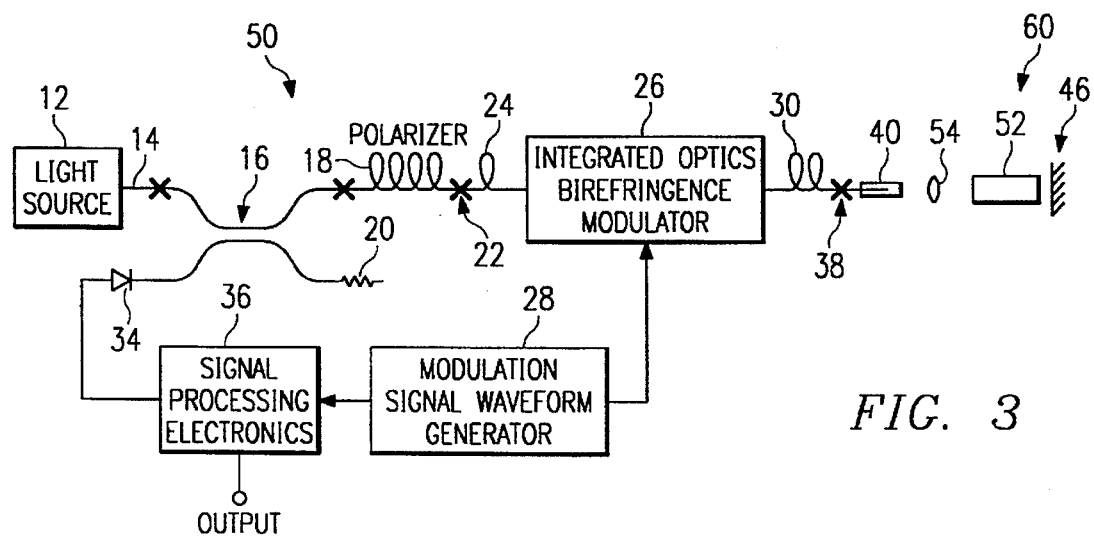
FIG. 3 is a schematic diagram of an embodiment of an in-line fiber optic interferometric magnetic field sensor.

FIG. 3 shows a magnetic field sensor configuration 50. In the magnetic field sensor 50, the passive sensing medium or sensing fiber 32 is replaced by a linear magnetically-sensitive material 52 for configuring the system to measure local magnetic fields. The sensing medium 52 of the magnetic field sensor 50 may be constructed from a high Verdet constant material such as an iron garnet or a high Verdet constant glass. The light from the polarization maintaining fiber bus 30 first enters a 45° splice 38, passes through a quarter wave plate 40, and a collimating lens 54, such as a GRIN lens before entering the magnetically-sensitive material 52.

Referring to FIGS. 1–3, a reflector 46, such as a mirror or mirrored surface, terminates the sensing regions 60 of the sensors 10, 10' and 50. The light is reflected by the mirror 46 and returns through the sensing region 60. The sense of circular polarization of the light is reversed upon reflection, causing the right hand circularly polarized light wave to be converted to left hand circularly polarized for its return trip through the magnetic field sensing region 60, and vice versa for the left hand circularly polarized light. Since the sense of polarization and the direction of the light are reversed for both light waves during their return trip through the sensing region 60, the relative differential phase shift accumulated between them during the first pass through the sensing region 60 is doubled during the return trip. For example, the total phase shift, $\Delta\phi$, accumulated between the two light waves in the double pass sensing region 60 is thus $\Delta\phi=4VNI$, where V is the Verdet constant of the fiber glass, N is the number of turns of sensing fiber around the current carry wire 44 and I is the current flowing in the wire 40.

After the light has made its double pass through the sensing region 60, the light wave that was originally in the first principle axis of the polarization maintaining fiber bus 30 returns to the bus 30 linearly polarized along its second principle axis, and the light wave that was originally in the second principle axis of the polarization maintaining fiber bus 30 returns to the bus 30 linearly polarized along its first principle axis. The light waves then pass through the birefringence modulator 26 and its pigtail 24 a second time, and are finally brought together and interfered by the 45° splice 22 and the polarizer 18. A portion of this light is then coupled to the photodetector 34 via the polarization maintaining beam splitter 16.

The two light waves have undergone exactly the same polarization evolution throughout the optical circuit, only in reverse order. Because the sensing medium is in-line with respect to the optic fiber, it may be seen that the sensing region 60 is positioned at the mid-point of the optical path traversed by both light waves. Therefore, the only phase difference between the two light waves is that generated by the presence of a magnetic field in the sensing region 60.

The intensity of the light detected by the photodetector 34 of FIG. 1 is related to the electric current flowing in the wire and to the modulation waveform applied to the birefringence modulator 26 through the relation:

$$I_D = \frac{I_O}{2} \cdot \{1 + \cos[4vni + \phi(t) - \phi(t-\tau)]\}$$

where $I_D$ is the total detected power, $I_O$ is the power falling on the photodetector 34 in the absence of electric current and birefringence modulation, $\phi(t)$ is the birefringence modulation waveform present in the birefringence modulator, and $\tau$ is the round trip delay time from the birefringence modulator 26 to the end of the sensor 10 and back. As discussed above, $\phi(t)$ may be a sine wave, a square wave, or another periodic waveform. In addition to containing a periodic waveform component, $\phi(t)$ may also contain a ramp-like component, so that the difference between $\phi(t)$ and $\phi(t-\tau)$ is a constant plus a periodic waveform. The slope of the ramp, and thus the value of the constant may be chosen to cancel the electric current induced phase, or 4VNI. Thus, the value of the current being sensed may be determined from the slope of the ramp necessary to cause the cancellation to occur.

Constructed in this manner, the sensitivity to mechanical or thermal disturbances to the polarization maintaining fiber bus 30 is greatly reduced, since both light waves travel in the same fiber and are subjected to the same disturbances simultaneously. Because disturbances are common to both light waves, no differential phase shift is induced. Accordingly, the present invention provides a fiber optic interferometric sensor which provides the low noise, low drift, and stable scale factor advantages of the Sagnac interferometer, but doubles its signal and substantially reduces the lead sensitivity to mechanical and thermal disturbances. In addition, the configuration of the present invention does not require that the current carrying wire be broken or disconnected for the installation of the sensor.

Figure 4:
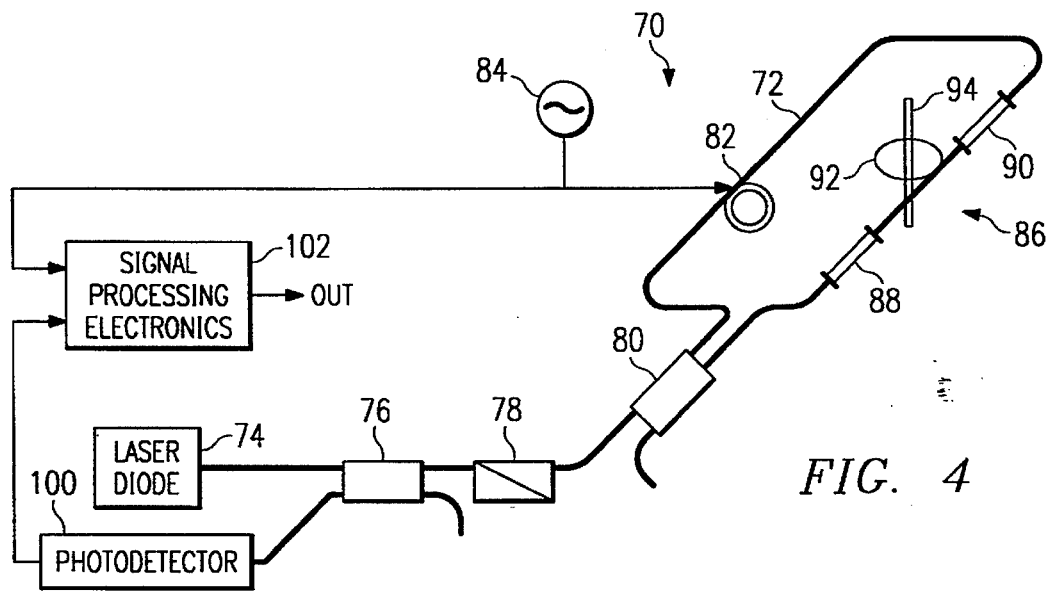
FIG. 4 is a schematic diagram of an embodiment of a Sagnac loop all fiber current sensor.

Another sensor configuration based on the Sagnac loop is an all-fiber current sensor 70. Referring to FIG. 4, the body of the Sagnac interferometer current sensor 70 is constructed from a polarization maintaining fiber 72. A light source such as a laser diode 74 generates a broadband light that is coupled into the fiber 72. The light passes through a directional coupler and is linearly polarized by a fiber polarizer 78. The linearly polarized light is then coupled into the loop portion of the sensor as two counter-propagating linearly polarized light waves by another directional coupler 80. A phase modulator 82 applies a periodic signal 84 to phase modulate or dither the light waves. Just before the two light waves enter the sensing region 86, they pass through the quarter wave plates 88 and 90, respectively, oriented with the principle axes at 45° with respect to the axes of the polarization maintaining fiber 72 of the Sagnac interferometer 70.

Immediately following the quarter wave plates 88 and 90 is a sensing fiber 92 preferably made from a low birefringence fiber. The sensing fiber 92 is wrapped around a current-carrying wire 94 one or more times. The purpose of the quarter wave plates 88 and 90 is to convert the linearly polarized light from the polarization maintaining fiber 72 of the Sagnac loop 70 to circularly polarized light. There is no fundamental advantage of using right or left handed circularly polarized light in the sensing region 86. Exiting the sensing region 86, one light wave continues on and passes through the quarter wave plate 88, and the other light wave passes through the other quarter wave plate 90. The quarter wave plates 88 and 90 now convert both light waves back to linearly polarized light aligned with the polarization maintaining fiber 72 of the Sagnac loop 70. The returning light waves pass through the directional couplers 80 and 76, and fall on a photodetector 100, which provides an output signal to a signal processor 102. The signal processor 102 then generates an output indicative of the magnitude of the current flowing in the wire 94.

Quarter wave plate non-idealities, either arising from angular misalignments or from deviations from quarter wave operation, create only second order errors in the sensor output. Quarter wave plate errors cause light to be coupled to the unused axis of the polarization maintaining fiber 72 of the Sagnac loop 70, but which is eventually rejected by the polarizer 78 in its common input/output port.

A highly sensitive measurement of the current can be made using state-of-the-art Sagnac interferometers for determining the non-reciprocal phase shift. For many applications, including FIGS. 1, 2, 4, and 6, this means that a very short sensing fiber is needed. Therefore, one to five loops of low birefringence fiber as the sensing fiber wound around the current carrying wire are sufficient. As discussed above, the use of a short sensing fiber is advantageous because its total birefringence will be minimized. In addition, the total non-reciprocal phase shift accumulated in the sensing region may be increased by using a sensing fiber with a small amount of linear birefringence. This causes some power to be lost to the unused Sagnac loop axis, but a good system can usually withstand a small loss of power.

Fiber optic quarter wave plates 88 and 90 may be constructed from a low birefringence fiber wound around a relatively small diameter. However, the quality of quarter wave plates constructed in this manner has been shown to be poor. An alternative is to use a short length of polarization maintaining fiber. The polarization beat length of the polarization maintaining fiber is preferably long enough to facilitate splicing this fiber between the Sagnac loop fiber 72 and the sensing fiber 92.

In order to minimize thermal and vibration induced non-reciprocities, the sensing region 86 is preferably located near the center of the loop or midway of the path traveled by the light waves. Configured in this manner, vibration induced polarization modulation in the sensing region 86 as well as temperature changes are seen simultaneously by the counter-propagating waves and thus contribute no error. In addition, points within the loop that are symmetric with respect to its center are preferably co-located to provide thermal and vibration immunity. This may be accomplished by twisting the two fibers leading to the sensing region 86 together or packing them in the same housing or cable. This also ensures that the Sagnac loop encloses minimal area making it insensitive to rotations.

Figure 5:
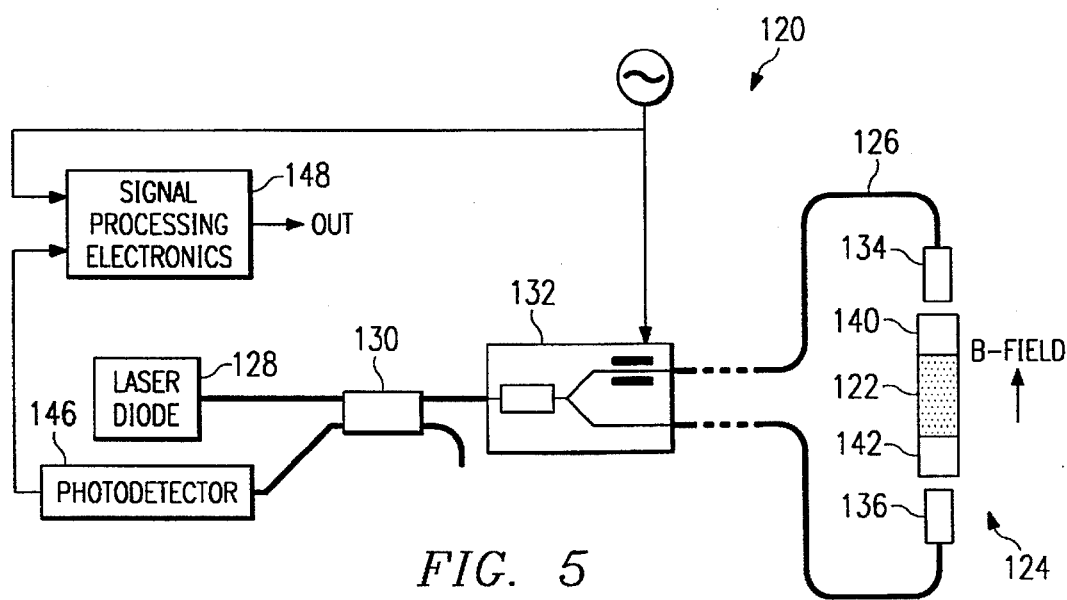
FIG. 5 is a schematic diagram of a Sagnac loop magnetic field sensor.

A highly sensitive magnetic field sensor 120 may also be constructed using the Sagnac loop. Referring to FIG. 5 for the magnetic field sensing configuration, the principle of operation is the same as for the current sensor 70 shown in FIG. 4. The difference is that instead of using a sensing fiber loop wrapped around a current carrying wire, a high Verdet constant material 122 is used for the sensing region 124.

The body of the Sagnac interferometer is preferably constructed from a polarization maintaining fiber 126 formed in a loop. A laser diode 128 emits light into the fiber 126, which passes through a directional coupler 130. The light is coupled to an integrated optical circuit 132, which includes a polarizer, a coupler and a phase modulator to linearly polarize and phase modulate the light. The counter-propagating light waves, going around the loop, pass through quarter wave plates 134 and 136 with their principle axes at 45° with respect to the axes of the polarization maintaining fiber 126. The quarter wave plates 134 and 136 convert the linearly polarized light to circularly polarized light. GRIN lenses 140 and 142 are positioned immediately after the quarter wave plates 134 and 136 to receive the circularly polarized light. The sensing region 124, constructed of a high Verdet constant material 122, is positioned immediately after the GRIN lenses 140 and 142. The high Verdet constant material 122 may be an iron garnet crystal, a short piece fiber constructed from a high Verdet constant glass, or any like material with similar properties. The light exiting the sensing region 124 is converted back to linearly polarized light aligned with the polarization maintaining fiber 126 of the Sagnac loop. The light is received by a photodetector 146, which provides an input to a signal processor 148 for appropriate signal processing.

Figure 6:
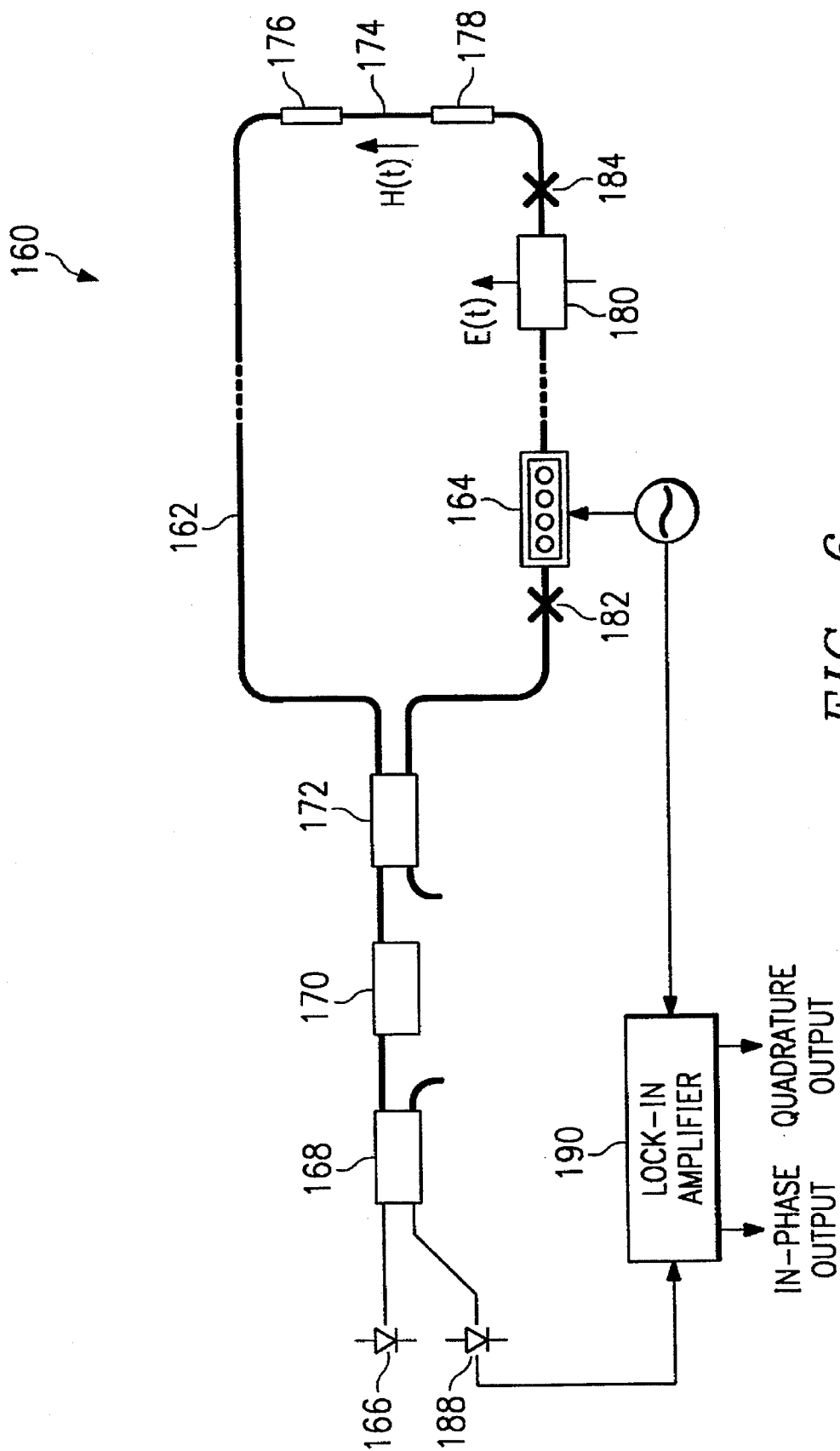
FIG. 6 is a schematic diagram of a Sagnac loop sensor for simultaneous measurement of external magnetic and electric fields.

Referring to FIG. 6, a Sagnac interferometer-based electric and magnetic field sensor 160 is shown. The sensor 160 may also be used to simultaneously measure the rotation of the sensor loop and an electric field. The sensor 160 is preferably constructed from a polarization maintaining fiber loop 162 and an integrated optics phase modulator 164 that exhibits some birefringence modulation. Light is generated by a laser diode 166, passes through a directional coupler 168, a polarizer 170, and 172, and enters the loop 162. The magnetic field is sensed by a sensing medium 174 flanked by two quarter wave plates 176 and 178, as described above. The electric field is sensed by an electric field probe. The electric field probe may be constructed from an electro-optic birefringent plate 180, whose axes are aligned to the birefringence axes of the phase modulator 164. The birefringent plate 180 and the phase modulator 164 are rotated by an angle $\theta_I$ with respect to the linearly polarized light. The angle $\theta_I$ may be set to be approximately six degrees. The rotation at coupling points 182 and 184 generates two orthogonally polarized co-propagating light waves. The necessary polarization splicing and coupling points 182 and 184 enabling the rotation are marked by Xs in FIG. 6.

The counter-propagating light thus enter and exist the loop 162 linearly polarized, and are tapped out to a detector 188 and a signal processor circuit 190, which may include a two-channel lock-in amplifier. The magnitude of the external fields E(t) and H(t) are indicated by the quadrature output and in-phase output, respectively.

The output signals are the result of interference between the counter-propagating beams in the fiber loop 162. A phase difference results when they are differently affected by non-reciprocal phenomena, such as the Faraday effect. In this particular case, the counter-propagating beams are circularly polarized when passing through the Faraday sensing medium 174 placed in the optical path in the loop. The induced phase difference is then given by:

$$\Delta\phi = 2V \int \vec{H} \cdot \vec{dl}$$

where H is the magnetic field integrated along the interaction length, and V is the Verdet constant of the sensing material. Using a phase modulation scheme, where $$\phi_m \sin\left(\omega_m\left(t - \frac{\tau}{2}\right)\right)$$

is the modulation signal, the $\Delta\phi$ may be retrieved by employing the lock-in amplifier 190 to measure the first harmonic amplitude A(t) of the output signal. For small $\Delta\phi$, A(t) can be written as:

$$A(t) \propto [J_1(\phi_M)\Delta\phi]\cos(\omega_m),$$

where $$\phi_M = 2\phi_m \sin\left(\omega_m \frac{\tau}{2}\right)$$

is the phase modulation depth and $\tau$ is the loop transit time. $J_1$ is the first order Bessel function.

The signal A(t) is not the only signal that may be demodulated at the modulation frequency. Residual birefringence modulation induced by the phase modulator 164 produces a usually unwanted signal $A_Q(t)$ that is in quadrature with A(t). In the interferometer, the so-called single mode fiber in fact supports two orthogonal polarization modes, which may couple at certain locations in the fiber loop. The signal $A_Q(t)$ results from the interference between co-propagating orthogonally polarized waves, which are produced when the input light is split into different polarization states by a coupling point 182 before the phase modulator 164, and brought together by a second coupling point 184 after the phase modulator 164. Due to the birefringence modulation, the two waves will experience different amounts of phase modulation. If $K_1$ and $K_2$ are the strengths of the polarization cross coupling at locations 182 and 184 in the loop before and after the phase modulator 164, we can express $A_Q(t)$ as proportional to:

$$A_Q(t) \propto J_1(\phi_B)\cos\left(\omega_m\left(\frac{\tau}{2}\right)\right) K_1 K_2 |\gamma(\delta\tau_g)| \sin(\Delta\phi_p)\sin(\omega\tau)$$

Here $\gamma$ is the coherence function of the light source, $\Delta\phi_p$ and $\delta\tau_g$ are respectively the phase difference and the group delay time experienced by the orthogonally polarized waves between the coupling points, and $\phi_B$ is the amplitude of the birefringence modulation. The equation above suggests a way to make use of the quadrature signal, in particular for electric field sensing. If the amount of birefringence present between the coupling points 182 and 184 is linearly dependent on the magnitude of the electric field, then $\Delta\phi_p$ varies with the external electric field to be sensed.

Although the present invention and its advantages have been described in detail, it should be understood that various changes, substitutions and alterations can be made therein without departing from the spirit and scope of the invention as defined by the appended claims.

What is claimed is:

1. An optical interferometric magnetic field sensor, comprising:

a polarization maintaining optic fiber forming an optical path;

two linearly polarized light waves traveling in said polarization maintaining optic fiber on said optical path;

at least one fiber quarter wave plate coupled to said optic fiber at substantially a mid-point in said optical path for converting said two linearly polarized light waves into two opposingly circularly polarized light waves traveling on said optical path toward a sensing region, said fiber quarter wave plate being constructed from at least one short section of long beat length polarization maintaining fiber;

said sensing region including a sensing medium sensitive to a magnetic field coupled to said optic fiber at generally said mid-point in said optical path, said opposingly circularly polarized light waves passing through said sensing medium, and said magnetic field causing a differential phase shift in said opposingly circularly polarized light waves; and a detector coupled to said optic fiber detecting said differential phase shift and producing an output in response thereto.

2. The optical interferometric sensor, as set forth in claim 1, wherein said sensing medium is an optical fiber.

3. The optical interferometric sensor, as set forth in claim 1, wherein said sensing medium is a low birefringence optical fiber.

4. The optical interferometric sensor, as set forth in claim 1, wherein said sensing medium is constructed from a high Verdet constant material.

5. The optical interferometric sensor, as set forth in claim 1, wherein said polarization maintaining optic fiber forms a loop, said sensing medium being located substantially midpoint of said optic fiber loop, said optic fiber loop having two optic fiber portions extending from said sensing medium and being co-located with one another.

6. The optical interferometric sensor, as set forth in claim 5, comprising first and second fiber quarter wave plates disposed in said optical path substantially adjacent to said sensing medium, converting two counter-propagating linearly polarized light waves into two counter-propagating circularly polarized light waves prior to entry of said sensing medium and converting said circularly polarized light waves into linearly polarized light waves after exiting said sensing medium.

7. The optical interferometric sensor, as set forth in claim 5, further comprising a phase modulator coupled to said optic fiber and phase modulating said two counter-propagating linearly polarized light waves by changing a state of birefringence during travel time of said light waves.

8. The optical interferometric sensor, as set forth in claim 5, further comprising:

a first coupler splitting said linearly polarized light waves into two orthogonally polarized co-propagating light waves;

a birefringence modulator disposed in said optical path and varyingly phase modulating said two co-propagating light waves;

a second sensing medium sensitive to an electric field disposed in said optical path;

a second coupler combining said two orthogonally polarized co-propagating light waves; and said detector producing an in-phase output indicative of a magnitude of the magnetic field and a quadrature output indicative of a magnitude of the electric field.

9. The optical interferometric sensor, as set forth in claim 8, wherein said second sensing medium is an electro-optic birefringence plate.

10. The optical interferometric sensor, as set forth in claim 8, further comprising a birefringence modulator pigtail having a sufficient length to depolarize said light waves.

11. The optical interferometric sensor, as set forth in claim 1, further comprising a reflector disposed in said optical path substantially adjacent to said sensing medium, said reflector reflecting said circularly polarized light waves back through said sensing medium, said reflector further reversing the sense of circular polarization of said light waves.

12. The optical interferometric sensor, as set forth in claim 11, wherein said fiber quarter wave plate is disposed in said optical path substantially adjacent to said sensing medium, and converting two co-propagating linearly polarized light waves traveling along two axes of said optical path into co-propagating right and left hand circularly polarized light waves.

13. The optical interferometric sensor, as set forth in claim 11, further comprising:

a birefringence modulator coupled to said optic fiber and phase modulating two co-propagating linearly polarized light waves; and a fiber quarter wave plate disposed in said optical path adjacent to said sensing medium circularly polarizing said linearly polarized light waves.

14. The optical interferometric sensor, as set forth in claim 13, wherein said birefringence modulator comprises an integrated optics waveguide with electro-optic modulation.

15. The optical interferometric sensor, as set forth in claim 13, wherein said birefringence modulator comprises a polarization maintaining fiber wound piezoelectric modulator.

16. The optical interferometric sensor, as set forth in claim 13, wherein said birefringence modulator operates at a fundamental dither frequency of $\frac{1}{2}\tau$, where $\tau$ is the round trip propagation time between said birefringence modulator and said sensing medium.

17. The optical interferometric sensor, as set forth in claim 11, further comprising:

a light source injecting a broadband light into said optical path;

a linear polarizer linearly polarizing said broadband light; and said fiber quarter wave plate positioned at 45° with respect to said polarization maintaining optic fiber circularly polarizing said linearly polarized light waves.

18. An optical interferometric sensor for detecting a magnetic field, comprising:

an optic fiber having an initiating end and a terminating end and forming an optical path;

means coupled to said optic fiber for generating co-located right hand circularly polarized light wave and left hand circularly polarized light wave traveling along said optical path in a first direction from said initiating end toward said terminating end of said optic fiber;

a sensing medium sensitive to a magnetic field disposed in said optical path and coupled to said terminating end of said optic fiber, said co-located circularly polarized light waves passing through said sensing medium in a first direction, said magnetic field inducing a differential phase shift in said light waves;

a reflector coupled to said sensing medium and terminating end of said optic fiber and reflecting and reversing the polarization sense of said right and left hand circularly polarized light waves, said reflected circularly polarized light waves returning through said sensing medium in a second direction toward said initiating end of said optic fiber; and a detector coupled to said initiating end of said optic fiber detecting said differential phase shift in said light waves and producing an output in response thereto.

19. The optical interferometric sensor, as set forth in claim 18, wherein said right and left hand circularly polarized light wave generating means comprises a quarter wave plate disposed in said optical path immediately prior to said sensing medium, said quarter wave plate converting two co-propagating linearly polarized light waves traveling along two axes of said optic fiber into said right and left hand circularly polarized light waves, said quarter wave plate further converting said returning circularly polarized light waves into two linearly polarized light waves.

20. The optical interferometric sensor, as set forth in claim 19, further comprising:
a light source injecting a broadband light into said optic fiber;
a polarizer coupled to said optic fiber linearly polarizing said broadband light;
a 45° splice splitting said linearly polarized light into said two linearly polarized light waves.

21. The optical interferometric sensor, as set forth in claim 20, further comprising a birefringence modulator, coupled between said 45° splice and said quarter wave plate, phase modulating said linearly polarized light waves.

22. The optical interferometric sensor, as set forth in claim 21, wherein said birefringence modulator comprises an integrated optics waveguide with electro-optic modulation.

23. The optical interferometric sensor, as set forth in claim 21, wherein said birefringence modulator comprises a polarization maintaining fiber wound piezoelectric modulator.

24. The optical interferometric sensor, as set forth in claim 21, wherein said birefringence modulator operates at a fundamental dither frequency of $1/2\tau$, where $\tau$ is the round trip propagation time between said birefringence modulator and said sensing medium.

25. The optical interferometric sensor, as set forth in claim 19, wherein said quarter wave plate is constructed of a short section of long beat length polarization maintaining fiber.

26. The optical interferometric sensor, as set forth in claim 18, wherein said sensing medium is an optical fiber.

27. The optical interferometric sensor, as set forth in claim 18, wherein said sensing medium is a low birefringence optical fiber.

28. The optical interferometric sensor, as set forth in claim 18, wherein said sensing medium is constructed from a high Verdet constant material.

29. The optical interferometric sensor, as set forth in claim 18, wherein said reflector is a mirror.

30. An optical interferometric sensor, comprising:
a polarization maintaining optic fiber forming an optical loop;
a sensing medium sensitive to a magnetic field coupled to said optic fiber and disposed midway in said optical loop;
first and second quarter wave plates coupled to said optic fiber in close proximity to said sensing medium for converting two counter-propagating linearly polarized light waves into two counter-propagating circularly polarized light waves prior to passing through said sensing medium, and converting said circularly polarized light waves into linearly polarized light waves after exiting said sensing medium, said magnetic field inducing a differential phase shift in said circularly polarized light waves passing through said sensing medium, said first and second quarter wave plates being constructed from short sections of long beat length polarization maintaining fibers; and a detector coupled to said optic fiber detecting said differential phase shift and producing an output in response thereto.

31. The optical interferometric sensor, as set forth in claim 30, wherein said sensing medium is a low birefringence optical fiber.

32. The optical interferometric sensor, as set forth in claim 30, wherein said polarization maintaining optic fiber extending from said sensing medium being co-located with one another.

33. The optical interferometric sensor, as set forth in claim 30, further comprising:
a light source injecting a broadband light into said optic fiber; and
a polarizer coupled to said optic fiber linearly polarizing said broadband light.

34. The optical interferometric sensor, as set forth in claim 30, further comprising a phase modulator disposed in said optical loop phase modulating said linearly polarized light waves.

35. The optical interferometric sensor, as set forth in claim 30, further comprising:
a first coupler splitting a linearly polarized light wave into two orthogonally polarized co-propagating light waves;
a birefringence modulator disposed in said optical path and varyingly phase modulating said two co-propagating light waves;
a second sensing medium sensitive to an electric field disposed in said optical path;
a second coupler combining said two orthogonally polarized co-propagating light waves; and
said detector producing an in-phase output indicative of a magnitude of the magnetic field and a quadrature output indicative of a magnitude of the electric field.

36. The optical interferometric sensor, as set forth in claim 29, further comprising a birefringence modulator pigtail having a sufficient length to depolarize said light waves.

37. A loop optical interferometric sensor for simultaneous measurement of two physical quanties, comprising:
means for launching two counter-propagating light waves into an optical loop;
means for inducing a differential phase shift in said counter-propagating light waves in response to a first physical quantity;
means for inducing a variation in polarization states of each respective light wave in response to a second physical quantity;
means for selecting one polarization state; and
means for detecting said differential phase shift and said selected polarization state.

38. The loop optical interferometric sensor, as set forth in claim 37, wherein said means for inducing a variation in polarization states comprises a birefringence modulator.

39. The loop optical interferometric sensor, as set forth in claim 37, wherein said first physical quantity is a magnetic field, and said second physical quantity is an electric field.

40. The loop optical interferometric sensor, as set forth in claim 37, wherein said first physical quantity is a rotational movement of said loop sensor.

41. An in-line optical interferometric magnetic field sensor, comprising:

a polarization maintaining optic fiber forming a linear optical path;

two linearly polarized broadband light waves launched into said fiber and traveling in said polarization maintaining optic fiber on said linear optical path;

a fiber quarter wave plate coupled to said optic fiber at substantially a mid-point in said linear optical path for converting said two linearly polarized light waves into two opposingly circularly polarized light waves traveling on said optical path toward a sensing region;

a reflector terminating said polarization maintaining fiber at an end of said optical path and in close proximity to said fiber quarter waveplate;

said sensing region including a sensing medium sensitive to a magnetic field coupled to said optic fiber at generally said mid-point in said optical path, said opposingly circularly polarized light waves passing through said sensing medium twice having been reflected by said reflector, and said magnetic field causing a double differential phase shift in said opposingly circularly polarized light waves; and a detector coupled to said optic fiber detecting said differential phase shift and producing an output in response thereto.

42. The sensor, as set forth in claim 41, further comprising:

a birefringence modulator disposed in said optical path and varying phase modulating said linearly polarized light waves; and a birefringence modulator pigtail of sufficient length to depolarize light passing therethrough prior to said birefringence modulator.

* * * * *

UNITED STATES PATENT AND TRADEMARK OFFICE
CERTIFICATE OF CORRECTION

PATENT NO. : 5,644,397
DATED : Jul 1, 1997
INVENTOR(S) : Blake

It is certified that error appears in the above-identified patent and that said Letters Patent is hereby corrected as shown below:

Column 1, line 12, after "interferometric" insert -- current and magnetic field --.

Signed and Sealed this

Twenty-fifth Day of November, 1997

Attest:

BRUCE LEHMAN

*Attesting Officer*      *Commissioner of Patents and Trademarks*